US007362820B2

(12) United States Patent
Aman et al.

(10) Patent No.: US 7,362,820 B2
(45) Date of Patent: Apr. 22, 2008

(54) APPARATUS AND METHOD FOR MODULATING AND DIGITALLY PREDISTORTING A SIGNAL IN A MULTIPLE MODULATION SCHEMES

(75) Inventors: Asad U. Aman, Schaumburg, IL (US); Thomas J. Kundmann, Cary, IL (US); Gregory T. Nash, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 170 days.

(21) Appl. No.: 11/131,714

(22) Filed: May 18, 2005

(65) Prior Publication Data

US 2006/0262878 A1 Nov. 23, 2006

(51) Int. Cl.
*H04K 1/02* (2006.01)

(52) U.S. Cl. ...................................... 375/297; 375/295

(58) Field of Classification Search ................ 375/295, 375/296, 297, 308, 305
See application file for complete search history.

(56) References Cited

U.S. PATENT DOCUMENTS 6,369,666 B1 * 4/2002 Simon et al. ............... 332/100
6,724,831 B1 * 4/2004 Hasegawa et al. .......... 375/297
7,123,663 B2 * 10/2006 De Gaudenzi et al. ..... 375/279
2005/0100105 A1 * 5/2005 Jensen ........................ 375/259
2005/0220219 A1 * 10/2005 Jensen ........................ 375/302
2005/0239422 A1 * 10/2005 Jafari et al. ................. 455/126
2005/0249312 A1 * 11/2005 Bode et al. ................. 375/308
2006/0050812 A1 * 3/2006 Hietala et al. .............. 375/308
2006/0170505 A1 * 8/2006 Humphreys et al. .......... 331/16

OTHER PUBLICATIONS

ETSI TS 100 959 v8.4.0.(Nov. 2001), Digital cellular telecommunications system (Phase 2+); Modulation (3GPP TS 05.04 version 8.4.0 Release 1999, pp. 1-11.

* cited by examiner

*Primary Examiner*—Emmanuel Bayard

(57) ABSTRACT

A programmable modulator (100) is programmable to operate in either of a GMSK or 8PSK mode. When operating in a GMSK mode, a signal modulating circuit 105 receives (210) a bit stream (110), maps the bit stream (110) to a phase value in complex I, Q form and applies a progressive rotation to the phase value according to GMSK specifications. The output (140) is filtered by a filter circuit (135), preferably using a complex Finite Impulse Response (FIR) filter using the standard coefficients for an 8PSK modulation to create (215) an approximate GMSK output (165). A GMSK correction circuit (150) determines a correction term that is added to the filter circuit output (165) so as to correct amplitude variations to allow the output to conform to GSM/EDGE standards. The same modulator (100) may be programmed to operate in an 8PSK mode with linear predistortion.

17 Claims, 3 Drawing Sheets

BIT STREAM SIGNAL SOURCE
MAPPER CIRCUIT
ROTATION APPLICATION CIRCUIT
FILTER CIRCUIT
SUMMING CIRCUIT
POWER AMPLIFIER
GMSK CORRECTION CIRCUIT
POWER AMPLIFIER OUTPUT DETECTOR
COEFFICIENT DETERMINING CIRCUIT
FILTER PARAMETER DETERMINING CIRCUIT
115 100 105 180 185 140 135 160 170 130 165 110 175 198 155 145 150 194 192 196 120 190 125

POWER AMPLIFIER
130
196
POWER AMPLIFIER OUTPUT DETECTOR
198
170
125
SUMMING CIRCUIT
160
165
145
194
FILTER PARAMETER DETERMINING CIRCUIT
FILTER CIRCUIT
135
100
192
155
140
COEFFICIENT DETERMINING CIRCUIT
ROTATION APPLICATION CIRCUIT
185
180
GMSK CORRECTION CIRCUIT
105
115
MAPPER CIRCUIT
175
120
190
150
110
BIT STREAM SIGNAL SOURCE

APPARATUS AND METHOD FOR MODULATING AND DIGITALLY PREDISTORTING A SIGNAL IN A MULTIPLE MODULATION SCHEMES

TECHNICAL FIELD

This invention relates generally to communication systems and more particularly to a modulator for modulating and digitally predistorting a signal in more than one modulation scheme.

BACKGROUND

Modulators for various wireless communication systems are known in the art. Specifically, different modulators exist for modulating wireless communication signals sent under different communication schemes. For example, data or voice communications must be modulated into a signal that a mobile station, such as a cell phone or other mobile communication device, can send or receive. Many wireless communication schemes are known in the art such as Global System for Mobile communications ("GSM"), General Packet Radio Service ("GPRS"), EDGE (Enhanced Data rates for Global Evolution), and so forth. Each of these communication schemes has a unique modulation method for transmitting data such as Gaussian Minimum Shift Keyed ("GMSK"), 8 Phase Shift Keyed ("8PSK"), and so forth.

Given the number of wireless communication schemes, there is a need for mobile stations and base stations that can receive and transmit information in more than one wireless communication scheme or modulation method. To transmit and receive data in multiple schemes or modulations, however, a base/mobile station typically needs a different modulator for each transmission method, and including multiple modulators increases the amount of circuitry and logic resources used within a base/mobile station and the amount of battery drain on the mobile station. Alternatively, a base/mobile station may use a single modulator that is adapted to modulate data in more than one communication scheme—known modulators with such a capacity typically need increased logic and memory resources to perform the necessary calculations and conversions to modulate a signal in more than one wireless communication scheme. Moreover, known modulators do not effectively incorporporate predistortion of the modulated signal to correct for certain errors in the signal introduced by, for example, a power amplifier that amplifies the modulator's output.

Also, the various communication schemes are regulated by various standards which must be met. As such, a further problem is ensuring that the wireless communication signals created by these modulators meet the various standards for the communication schemes.

BRIEF DESCRIPTION OF THE DRAWINGS

The above needs are at least partially met through provision of the apparatus and method for modulating and digitally predistorting a signal in multiple modulation schemes described in the following detailed description, particularly when studied in conjunction with the drawings, wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the arts will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Generally speaking, pursuant to these various embodiments, a programmable modulator is programmed to operate in either a GMSK or an 8PSK modulation mode. When operating in a GMSK mode, the modulator determines and sums a GMSK correction term with an approximate GMSK output. When operating in an 8PSK mode, the modulator uses digital predistortion to linearize the output from the modulator. So configured, the programmable modulator can modulate signals in either a GMSK communication scheme or in an 8PSK communication scheme using a minimum of logic resources and circuitry.

Figure 1:
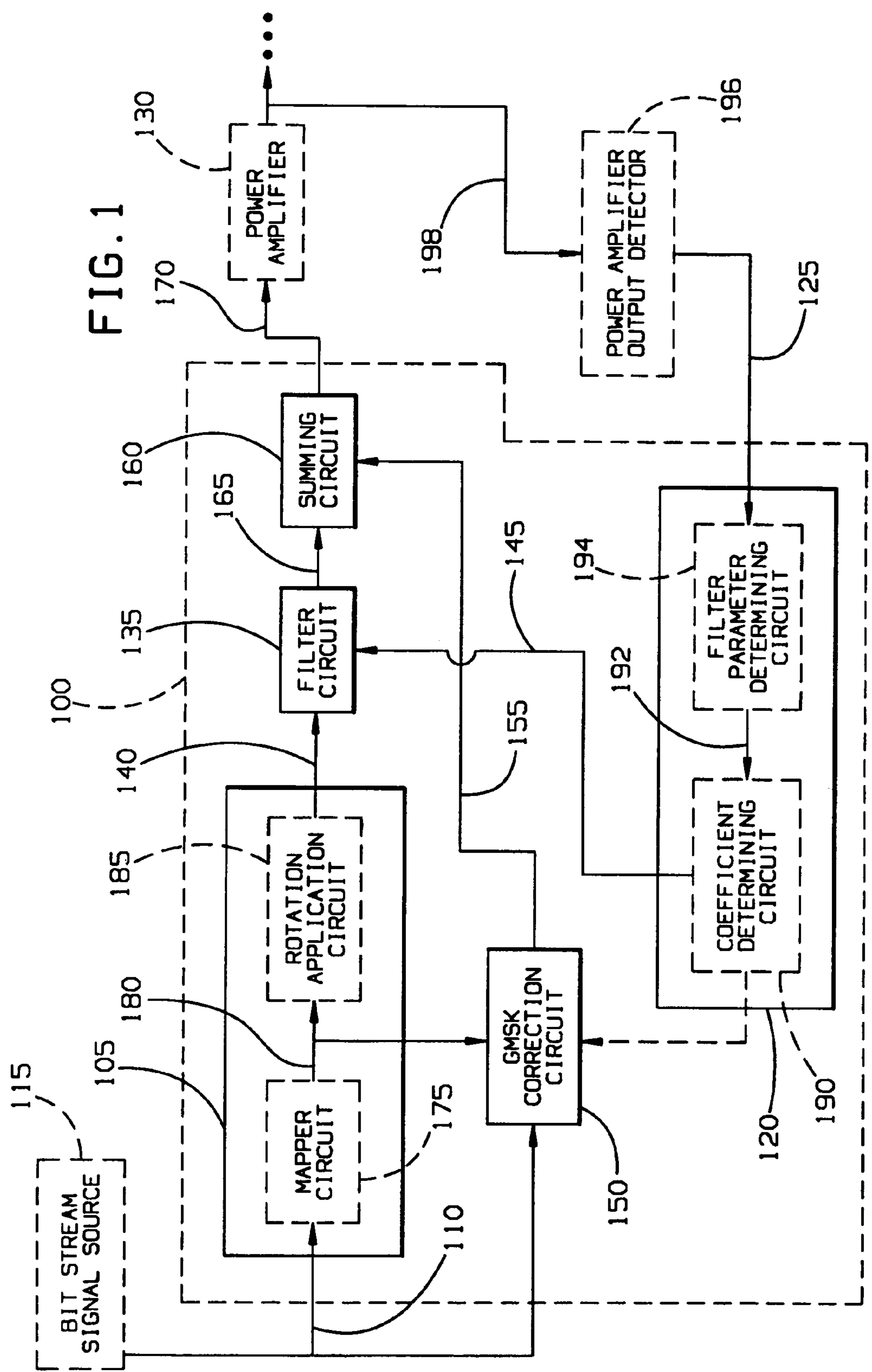
FIG. 1 is a block diagram as configured in accordance with various embodiments of the invention.

Referring now to the drawings, and in particular to FIG. 1, the programmable modulator 100 includes a signal modulating circuit 105 programmable to operate in either a GMSK mode or an 8PSK mode. The signal modulating circuit 105 receives a bit stream 110 from a bit stream signal source 115. The bit stream signal source 115 is typically other circuitry associated with the modulator that provides the data to be modulated and transmitted. The programmable modulator 100 also includes a linearization circuit 120 that is responsive to a feedback signal 125 from a power amplifier 130. A filter circuit 135 responds to the output 140 from the signal modulating circuit 105 and to an output 145 from the linearization circuit 120. The filter circuit 135 preferably is a complex Finite Impulse Response ("FIR") filter, as known in the art, using filter coefficients corresponding to an operating standard for 8PSK modulation. A GMSK correction circuit 150 responds in part to the bit stream signal 110 to create a GMSK correction circuit output 155. A summing circuit 160 sums the GMSK correction circuit output 155 with the output 165 from the filter circuit 135 to create an output 170 for the programmable modulator 100.

When the programmable modulator 100 operates in the 8PSK mode, the linearization circuit 120 is enabled or active and the GMSK correction circuit output 155 includes a signal corresponding to zero degrees in complex I, Q (where "I" is understood to correspond to an in-phase component and "Q" is understood to correspond to a quadrature component) form. When the programmable modulator 100 operates in the GMSK mode, part of the linearization circuit 120 is disabled or inactive, and the GMSK correction circuit output 155 includes a GMSK correction signal. Preferably, the GMSK correction signal corresponds to a second order correction term from the decomposition of the GMSK signal.

In a preferred embodiment, the signal modulating circuit 105 includes a mapper circuit 175 that is programmable to operate in either a GMSK or an 8PSK mode. The mapper circuit 175 is responsive to the bit stream signal 110 and creates a mapper circuit output 180. The signal modulating circuit 105 also may include a rotation application circuit 185, responsive to the mapper circuit output 180, that is also programmable to operate in either a GMSK or an 8PSK mode.

In another preferred embodiment, the linearization circuit 120 includes a coefficient determining circuit 190 that is responsive to a filter parameter determining circuit output 192 from a filter parameter determining circuit 194. The coefficient determining circuit 190 outputs the linearization circuit output 145. The filter parameter determining circuit 194 is responsive to the feedback signal 125 from the power amplifier 130 such that its output, when applied to the coefficient determining circuit 190, causes the linearization circuit output 145 to cause predistortion of the modulated signal 170.

One skilled in the art will recognize that the various individual circuits and elements described herein, although when combined as described to form an embodiment of the invention, are readily designed by one skilled in the art and may operate in conjunction with various software elements to perform according to this description. Other enabling structure can be applied by those skilled in the art as desired as well.

Figure 2:
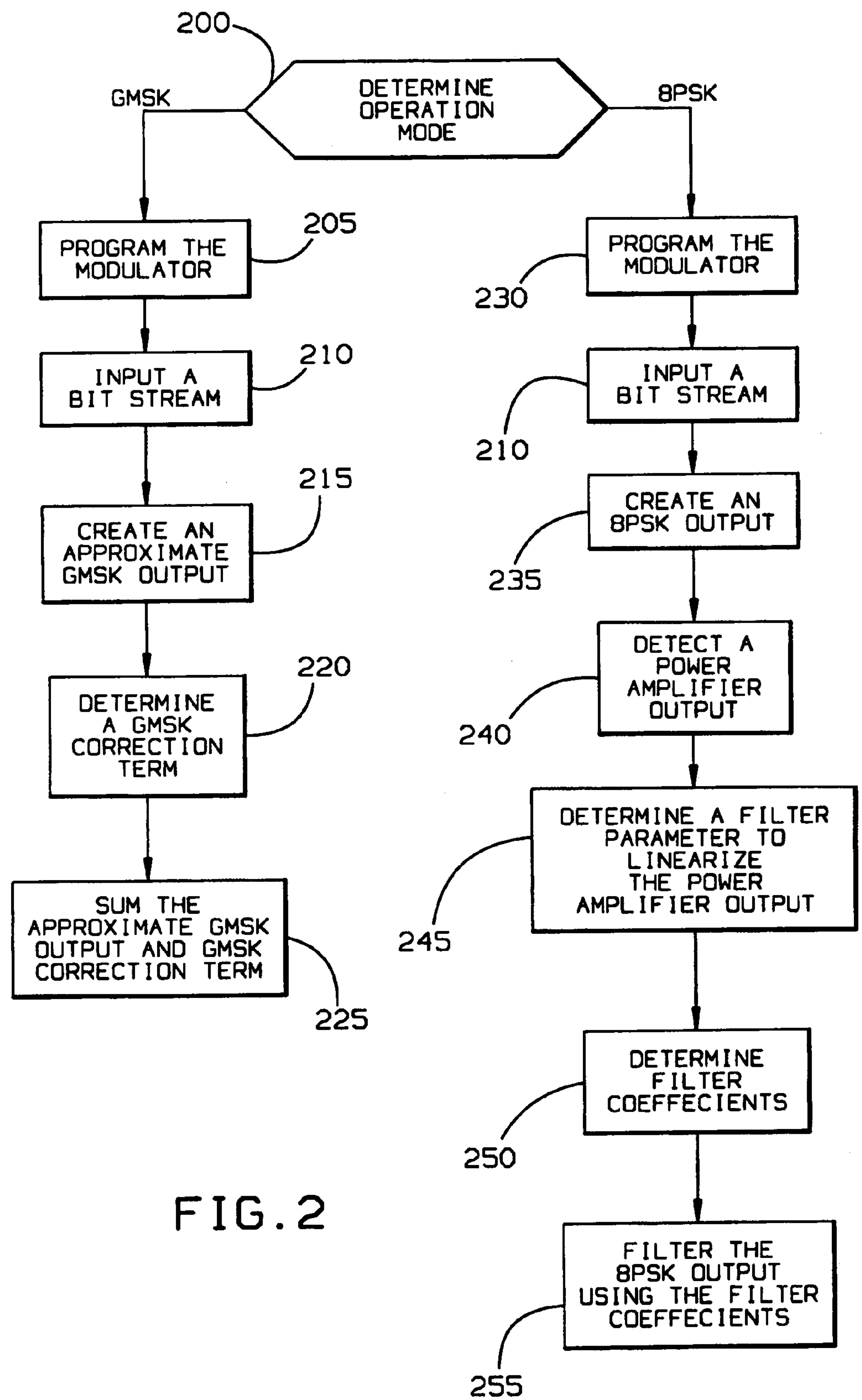
FIG. 2 is a flow diagram as configured in accordance with various embodiments of the invention.

The operation of the programmable modulator 100 is perhaps better understood with reference to FIG. 2. First, the base/mobile station or other device in which the programmable modulator 100 operates determines 200 in which mode the modulator 100 will operate, either in a GMSK mode or in an 8PSK mode. The device may make this determination 200 based on the amount of data to be transferred, the service plan of the user, or other appropriate factors. Then, depending on the mode, the modulator 100 will operate using somewhat different steps.

In the GMSK mode, the programmable modulator 100 is first programmed 205 by associated circuitry to operate in the GMSK mode. In a preferred embodiment, programming 205 the modulator 100 includes programming the mapper circuit 175 and the rotation application circuit 185 to operate in a GMSK mode. Further, the filter parameter determining circuit 194 is disabled, or, in other words, is not active when the modulator 100 operates in the GMSK mode. In this mode, the coefficient determining circuit 190 is still active, but receives no significant input from the filter parameter determining circuit 194, and outputs a constant signal, preferably corresponding to the default filter parameter of BT=0.3.

In the GMSK mode, the bit stream 110 is input 210 to the programmable modulator 100 whereupon a portion of the programmable modulator 100 creates 215 an approximate GMSK output. As is understood in the art, when modulating a signal in either a GMSK modulation or in an 8PSK modulation the bit stream 110 must be mapped or output into a phase value in complex I, Q form. In a GMSK modulation, the bit stream 110 is mapped to negative ninety degrees where the bit reads "zero" whereas the bit stream 110 is mapped to positive ninety degrees where the bit reads "one." Preferably, the mapper circuit 175 receives the bit stream 110 and outputs the phase value.

Next, a progressive rotation is applied to the phase value to create a rotated amplitude-phase value. In a GMSK mode, the complex I, Q form phase value preferably is rotated by a positive ninety degrees. In a preferred embodiment, the rotation application circuit 185 receives the phase value in complex I, Q form and applies the rotation to output the rotated amplitude-phase value in complex I, Q form.

Then, the filter circuit 135 creates a filtered rotated amplitude-phase value by filtering the rotated phase value. Preferably, the filter circuit 135 includes a complex Finite Impulse Response ("FIR") filter. In the preferred filter, the FIR filter uses the filter coefficients that correspond to the operating standard for 8PSK modulation, whether the modulator is operating in either the GMSK mode or 8PSK mode. When the modulator 100 operates in a GMSK mode, the output 165 of the filter circuit 135 is approximately a GMSK output even though the signal has been filtered according to the coefficients for an 8PSK modulation because the signal has been mapped and rotated according to a GMSK modulation.

The GMSK correction circuit 150 receives the bit stream 110 to determine 220 the GMSK correction term. The correction term is necessary to correct errors introduced by modulating and filtering the GMSK signal with an 8PSK modulation based filter. A mathematical decomposition of a GMSK signal demonstrates that the GMSK signal is a multi-order term with a first term very similar to an 8PSK signal output with a positive ninety degree progressive rotation. In other words, a GMSK signal modulated with an 8PSK modulation is close to a proper GMSK signal; however, the filtered rotated amplitude-phase value from the filter circuit 135 includes variations in amplitude that fail GSM/EDGE specifications. By adding the second term of the mathematical decomposition of the GMSK signal to the 8PSK filtered GMSK signal, the amplitude variations that exceed the GSM/EDGE specifications are eliminated. The correction term that corrects the amplitude variations corresponds to the second order term from the GMSK signal decomposition.

In a preferred embodiment, calculating the GMSK second order term involves filtering a modified data stream with a filter that is two periods in length. The modified data stream represents a Binary Phase Shift Keying ("BPSK") signal, as known in the art, with a positive ninety degree progressive rotation and a further data dependent positive or negative ninety degree offset. Given these offsets, the phase value for the second order term always jumps ninety degrees for every symbol period. Thus, in complex I, Q form, the I term will be zero for every other symbol period, and the Q term will be zero when the I term is non-zero. In this case, a filter with a length of two symbol periods can be simulated without significant processing or memory usage. Instead, a look-up table with a number of coefficients corresponding to the oversampling factor per symbol period can be used to simulate the filter at the second order and thereby determine the correction factor corresponding to the second order term.

Figure 3:
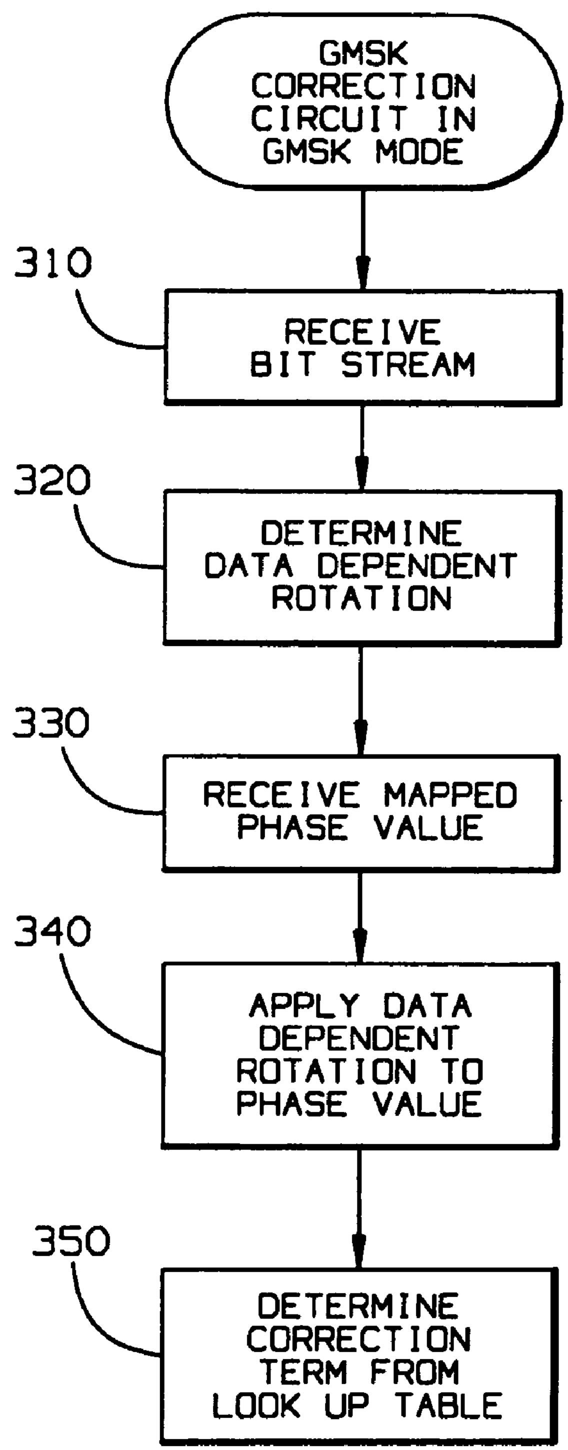
FIG. 3 is a flow diagram of the operation of a GMSK correction circuit in accordance with an embodiment of the invention.

Preferably, and with momentary reference to FIG. 3, the GMSK correction circuit 150 calculates the correction term by receiving 310 the bit stream 110 and the phase value 330 from the mapper circuit 175. The GMSK correction circuit 150 then determines 320 whether a positive or negative ninety degree rotation is applied to the phase value based upon the bit values from the bit stream 110, and the GMSK correction circuit 150 applies 340 the data dependent rotation. Next, the GMSK correction circuit determines 350 a correction factor from a previously calculated look up table stored in memory based upon the rotated phase value.

Referring again to FIG. 2, this correction factor is the GMSK correction term output from the GMSK correction circuit 150 and summed 225 with the approximate GMSK output. The summed value is output to a power amplifier 130 for transmission.

In the 8PSK mode, the programmable modulator 100 is programmed 230 to operate in the 8PSK mode. Preferably, the programming 230 includes programming the mapper circuit 175 and the rotation application circuit 185 to operate in an 8PSK mode. Further, the filter parameter determining circuit 194 and filter coefficient determining circuit 190 are enabled, or, in other words, are active when the modulator 100 operates in the 8PSK mode.

In the 8PSK mode, the bit stream 110 is input 210 to the programmable modulator 100 whereupon a portion of the programmable modulator 100 creates 235 an 8PSK output. As described above, when modulating a signal in an 8PSK modulation, the bit stream 110 must be mapped or output into a phase value in complex I, Q form depending on the bit stream values received.

Preferably, in an 8PSK modulation, the mapper circuit 175 receives the bit stream 110 and outputs the phase value in one of eight complex I, Q values depending on the bit stream values received. The phase values are determined according to the following relationships:

- a received bit stream of the value seven results in an output of zero degrees in complex I, Q form;
- a received bit stream of the value three results in an output of positive forty-five degrees in complex I, Q form;
- a received bit stream of the value two results in an output of positive ninety degrees in complex I, Q form;
- a received bit stream of the value zero results in an output of positive one hundred thirty five degrees in complex I, Q form;
- a received bit stream of the value one results in an output of position one hundred eighty degrees in complex I, Q form;
- a received bit stream of the value five results in an output of negative one hundred thirty five degrees in complex I, Q form;
- a received bit stream of the value four results in an output of negative ninety degrees in complex I, Q form; and
- a received bit stream of the value six results in an output of negative forty-five degrees in complex I, Q form.

Then, in the preferred embodiment, the rotation application circuit 185 applies a 67.5 degree progressive rotation to the phase value, and the rotated amplitude-phase value is filtered by the filter circuit 135 as discussed above. The filter then outputs an 8PSK output corresponding to an 8PSK modulated signal. Next, the summing circuit 160 sums the 8PSK output with the output of the GMSK correction circuit 150, which is a signal corresponding to zero in complex I, Q form when operating in an 8PSK mode, such that the 8PSK output is not changed by the GMSK correction circuit output.

With continuing reference to FIG. 2, when in the 8PSK mode, the programmable modulator 100 uses predistortion to linearize the output of the power amplifier 130 for the modulator 100. The power amplifier output 198 for the programmable modulator 100 is detected 240, preferably by a power amplifier output detector 196. The power amplifier output detector 196 includes known circuitry to detect the power amplifier output 198 and output a signal 125 corresponding to the power amplifier output 198. The linearization circuit 120 receives the signal 125 and determines filter parameters and coefficients to apply to the filter circuit 135 that causes the filter circuit 135 to linearize the output of the modulator 100 when in the 8PSK mode.

In a preferred embodiment, the filter parameter determining circuit 194 receives the signal 125 corresponding to the power amplifier output 198. The filter parameter determining circuit 194 starts with a baseline filter parameter of BT equaling 0.3. As is known in the art, the factor BT is a standard factor for modulating filters, and the BT factor of 0.3 is the factor amount called for in various wireless communication specifications including the 8PSK modulation standard. If the BT factor for the filter is varied, however, the output of the filter circuit 135 can be optimized and, for example, linearized. The filter parameter determining circuit 194, therefore, monitors the signal 125 corresponding to the power amplifier output 198 and determines 245 a filter parameter, such as the BT factor, that linearizes the power amplifier output 198. Known algorithms, for example, performed by the filter parameter determining circuit 194 can lead to the determination of a BT factor for the filter circuit 135 that improves the linearization of the modulator output.

The filter parameter determining circuit 194 then outputs a signal 192 corresponding to the determined filter parameter that is received by the coefficient determining circuit 190. The coefficient determining circuit 190, in turn, determines 250 the filter coefficients for the filter circuit 135 that correspond to the filter parameter. For example, the coefficient determining circuit 190 may look up from a previously calculated and stored table the filter coefficients that correspond to a BT factor of 0.29 if the filter parameter determining circuit 194 determines that a BT factor of 0.29 would linearize the power amplifier output 198. Alternatively, the coefficient determining circuit 190 may calculate the filter coefficients corresponding to the filter parameters using known methods. The filter coefficients are communicated to the filter circuit 135 such that the filter applied to the rotated amplitude-phase value at least partially linearizes the modulator output. In other words, the filter circuit 135 uses the filter coefficients to filter 255 the 8PSK output of the rotation application circuit 185.

In an alternative embodiment, the output from the linearization circuit 120 is also communicated to the GMSK correction circuit 150 where the filter coefficients determined by the linearization circuit 120 are used to modify the GMSK correction circuit's 150 lookup table. In this manner, the GMSK correction circuit output 155 may provide additional linearization for an 8PSK output for the programmable modulator when operating in an 8PSK mode. In this alternative embodiment, the GMSK correction circuit output 155 may be varied from zero based upon the signal received from the linearization circuit 120, and more particularly the filter parameter determining circuit 194, when operating in an 8PSK mode by applying the filter coefficients to the output 155 such that the summing circuit 160 linearizes or otherwise optimizes the modulator output when summing the GMSK correction circuit output 155 with the rotated amplitude-phase value.

Advantageously, the signal modulating circuit 105 can be adapted from a typical 8PSK modulator with only minor changes to operate as described herein. Further, the GMSK correction circuit operates with a minimum of logic resources because the correction terms can be either precalculated and stored in a lookup table or calculated with a small amount of processing power. Similarly, the described programmable modulator includes predistortion to linearize the 8PSK output without a significant addition of logic or memory resources.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

We claim:

1. A method comprising:

determining whether a programmable modulator is to operate in a Gaussian Minimum Shift Keyed (GMSK) mode or an 8 Phase Shift Keyed (8PSK) mode;

operating the programmable modulator in the GMSK mode in response to determining that the programmable modulator is to operate in the GMSK mode wherein operating the programmable modulator in the GMSK mode further comprises:

summing an approximate GMSK output and a GMSK correction term;

operating the programmable modulator in the 8PSK mode in response to determining that the programmable modulator is to operate in the 8PSK mode wherein operating the programmable modulator in the 8PSK mode further comprises:

detecting a power amplifier output from a power amplifier responsive to the programmable modulator;

determining a filter parameter that linearizes the power amplifier output using signals corresponding to the power amplifier output and to the modulator output;

determining filter coefficients corresponding to the filter parameter; and using the filter coefficients in a filter in the programmable modulator.

2. The method of claim 1 wherein operating the programmable modulator in the GMSK mode further comprises:

programming the programmable modulator to operate in the GMSK mode;

inputting a bit stream into the programmable modulator;

creating the approximate GMSK output using a portion of the programmable modulator; and determining the GMSK correction term; and wherein operating the programmable modulator in the 8PSK mode further comprises:

programming the programmable modulator to operate in the 8PSK mode;

inputting the bit stream into the programmable modulator;

creating an 8PSK output using the portion of the programmable modulator;

using predistortion to linearize the power amplifier output.

3. The method of claim 2 wherein programming the programmable modulator to operate in the GMSK mode farther comprises:

programming a mapper to operate in a GMSK mode;

programming a rotation applicator to operate in a GMSK mode;

disabling a filter parameter determining circuit;

disabling a filter coefficient determining circuit; and wherein programming the programmable modulator to operate in the 8PSK mode further comprises:

programming the mapper to operate in an 8PSK mode;

programming the rotation applicator to operate in an 8PSK mode;

enabling the filter parameter determining circuit;

enabling the filter coefficient determining circuit.

4. The method of claim 2 wherein using the portion of the programmable modulator further comprises:

mapping the bit stream to output a phase value;

creating a rotated phase value by rotating the phase value;

creating a filtered rotated amplitude-phase value by filtering the rotated phase value.

5. The method of claim 4 wherein creating a rotated phase value by rotating the phase value further comprises:

progressively rotating the phase value by 90 degrees when the programmable modulator operates in a GMSK mode; and progressively rotating the phase value by 67.5 degrees when the programmable modulator operates in an 8PSK mode.

6. The method of claim 4 wherein filtering the rotated phase value further comprises:

applying a complex Finite Impulse Response (FIR) filter using the filter coefficients that further correspond to an operating standard for 8PSK modulation.

7. The method of claim 2 wherein determining the GMSK correction term further comprises:

calculating a GMSK second order term that corresponds to a second order term that results from a decomposition of a GMSK signal.

8. An apparatus comprising:

a signal modulating circuit programmable to operate in either of both a Gaussian Minimum Shift Keyed (GMSK) mode or an 8 Phase Shift Keyed (8PSK) mode and responsive to a bit stream signal;

a linearization circuit responsive to a feedback signal from a power amplifier;

a filter circuit responsive to a signal modulating circuit output and further responsive to a linearization circuit output;

a GMSK correction circuit responsive to the bit stream signal; and a summing circuit responsive to a filter circuit output and a GMSK correction circuit output.

9. The apparatus of claim 8 wherein when the apparatus operates in the 8PSK mode:

the linearization circuit is enabled; and the GMSK correction circuit output comprises a signal corresponding to zero degrees in complex I, Q form; and when the apparatus operates in the GMSK mode:

the linearization circuit is partially disabled; and the GMSK correction circuit output comprises a GMSK correction signal.

10. The apparatus of claim 9 wherein the GMSK correction signal corresponds to a second order term that results from a decomposition of a GMSK signal.

11. The apparatus of claim 8 wherein the signal modulating circuit further comprises:

a mapper circuit programmable to operate in either of both a GMSK mode or an 8PSK mode, the mapper circuit responsive to the bit stream signal; and a rotation application circuit programmable to operate in either of both a GMSK mode or an 8PSK mode, the rotation application circuit responsive to a mapper circuit output.

12. The apparatus of claim 8 wherein the linearization circuit further comprises:

a coefficient determining circuit responsive to a filter parameter determining circuit output such that the coefficient determining circuit outputs the linearization circuit output; and a filter parameter determining circuit responsive to the feedback signal from a power amplifier such that the filter parameter determining circuit output, when applied to the coefficient determining circuit, causes the linearization circuit output to cause predistortion of a modulation signal in the filter circuit.

13. The apparatus of claim 8 wherein the filter circuit further comprises a complex Finite Impulse Response (FIR) filter using filter coefficients corresponding to an operating standard for 8PSK modulation.

14. An apparatus comprising:

a signal modulating means for receiving a bit stream and for outputting a signal modulating means output, the signal modulating means operational in a Gaussian Minimum Shift Keyed (GMSK) mode wherein the signal modulating means output is an approximate GMSK signal and in an 8 Phase Shift Keyed (8PSK) mode wherein the signal modulating means output is an 8PSK signal;

a filter means for filtering the signal modulating means output; and a GMSK correction means for receiving the bit stream, for determining and outputting a GMSK correction signal when operating in a GMSK mode, and for outputting a signal corresponding to zero degrees when operating in an 8PSK mode; and a summation means for summing a filter means output and a GMSK correction means output.

15. The apparatus of claim 14 further comprising:

a linearization means for linearizing a power amplifier output when the signal modulating means operates in an 8PSK mode.

16. The apparatus of claim 15 wherein the linearization means further comprises:

a power amplifier output detection means for creating a signal corresponding to the power amplifier output from a power amplifier responsive to the summation means;

a filter parameter determining means for using the signal corresponding to the power amplifier output from the power amplifier to determine a filter parameter for linearizing the power amplifier output; and a coefficient determining means for determining coefficients relating to the filter parameter, the filtering means being responsive to a signal corresponding to the coefficients.

17. The apparatus of claim 14 wherein the signal modulating means further comprises:

a mapper means for receiving the bit stream and mapping the bit stream into a complex I, Q mapper means output value;

a rotation means for receiving the complex I, Q mapper means output value, for progressively rotating the complex I, Q mapper means output value by 90 degrees when the signal modulating means operates in a GMSK mode, and for progressively rotating the complex I, Q mapper means output value by 67.5 degrees when the signal modulating means operates in an 8PSK mode.

* * * * *